(12) United States Patent
Yamaguchi et al.

(10) Patent No.: US 11,665,982 B2
(45) Date of Patent: May 30, 2023

(54) SUPERCONDUCTING WIRE

(71) Applicant: Sumitomo Electric Industries, Ltd., Osaka (JP)

(72) Inventors: Takashi Yamaguchi, Osaka (JP); Tatsuoki Nagaishi, Osaka (JP); Masaya Konishi, Osaka (JP); Takeshi Yamana, Osaka (JP); Kenji Motoi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1290 days.

(21) Appl. No.: 15/774,036

(22) PCT Filed: Nov. 11, 2015

(86) PCT No.: PCT/JP2015/081706
§ 371 (c)(1),
(2) Date: May 7, 2018

(87) PCT Pub. No.: WO2017/081762
PCT Pub. Date: May 18, 2017

(65) Prior Publication Data
US 2018/0337323 A1 Nov. 22, 2018

(51) Int. Cl.
*H01L 39/12* (2006.01)
*H01B 12/06* (2006.01)
*H01L 39/24* (2006.01)

(52) U.S. Cl.
CPC ........... *H01L 39/126* (2013.01); *H01B 12/06* (2013.01); *H01L 39/248* (2013.01); *H01L 39/2454* (2013.01); *Y02E 40/60* (2013.01)

(58) Field of Classification Search
CPC ................................ H01B 12/10; H01L 39/24
See application file for complete search history.

(56) References Cited

U.S. PATENT DOCUMENTS

2004/0023810 A1 2/2004 Ignatiev et al.
2013/0137579 A1 5/2013 Nagasu et al.
(Continued)

FOREIGN PATENT DOCUMENTS

CN 1400612 A 3/2003
CN 1596479 A 3/2005
(Continued)

OTHER PUBLICATIONS

Office Acton dated Jan. 11, 2019 that issued in U.S. Appl. No. 15/320,935.
(Continued)

*Primary Examiner* — Paul A Wartalowicz
(74) *Attorney, Agent, or Firm* — Faegre Drinker Biddle & Reath LLP

(57) ABSTRACT

A superconducting wire includes a substrate and a superconducting material layer. The substrate includes a first main surface and a second main surface opposite to the first main surface. The superconducting material layer is disposed on the first main surface. Along at least a part of the superconducting wire in a direction in which the superconducting wire extends, the superconducting material layer is disposed to cover a side surface of the substrate in a width direction of the substrate and cover at least a part of the second main surface. A thickness of the superconducting material layer located on the first main surface varies along the width direction. A maximum thickness of the superconducting material layer located on the second main surface is smaller than a maximum thickness of the superconducting material layer located on the first main surface.

10 Claims, 19 Drawing Sheets

(56) References Cited

U.S. PATENT DOCUMENTS

| | | |
|---|---|---|
| 2013/0217581 A1 | 8/2013 | Yoshizumi et al. |
| 2015/0038334 A1 | 2/2015 | Nagasu et al. |
| 2016/0359097 A1 | 12/2016 | Kurihara |
| 2017/0133127 A1 | 5/2017 | Yamaguchi et al. |
| 2017/0140852 A1 | 5/2017 | Yamaguchi et al. |

FOREIGN PATENT DOCUMENTS

| | | |
|---|---|---|
| CN | 103189934 A | 7/2013 |
| JP | 2004-031128 A | 1/2004 |
| JP | 2012-014883 A | 1/2012 |
| JP | 2012-169237 A | 9/2012 |
| JP | 2013-012406 A | 1/2013 |
| JP | 2013-246881 A | 12/2013 |
| JP | 2014-096582 A | 5/2014 |
| WO | WO-03/047006 A2 | 6/2003 |
| WO | WO-2013/018870 A1 | 2/2013 |
| WO | WO-2013/157286 A1 | 10/2013 |

OTHER PUBLICATIONS

Notice of Allowance dated Jun. 20, 2019 that issued in U.S. Appl. No. 15/320,935.
Notice of Allowance dated Jul. 17, 2019 that issued in U.S. Appl. No. 15/320,923.
Notice of Allowance dated Apr. 10, 2019 that issued in U.S. Appl. No. 15/320,935.
Notice of Allowance dated Oct. 27, 2021 that issued in U.S. Appl. No. 16/574,907.
Office Action dated Apr. 28, 2021 that issued in U.S. Appl. No. 16/574,907.
U.S. Appl. No. 16/574,907, Yamaguchi.
Notice of Allowance dated Feb. 8, 2019 that issued in U.S. Appl. No. 15/320,923.

SUPERCONDUCTING WIRE

TECHNICAL FIELD

The present invention relates to a superconducting wire, and more specifically relates to a superconducting wire in which a superconducting material layer is formed on a substrate.

BACKGROUND ART

In recent years, development of a superconducting wire in which a superconducting material layer is formed on a metal substrate has been in progress. In particular, an oxide superconducting wire is of interest. The oxide superconducting wire includes a superconducting material layer made of an oxide superconductor which is a high-temperature superconductor having a transition temperature equal to or higher than the liquid nitrogen temperature.

Such an oxide superconducting wire is generally manufactured by forming an intermediate layer on an orientation-aligned metal substrate, forming an oxide superconducting material layer on the intermediate layer, and further forming a stabilizing layer of silver (Ag) or copper (Cu) (see for example Japanese Patent Laying-Open No. 2013-12406 (PTD 1)).

CITATION LIST

Patent Document

PTD 1: Japanese Patent Laying-Open No. 2013-12406

SUMMARY OF INVENTION

Technical Problem

The superconducting wire configured in the above-described manner has a multilayer structure in which a ceramic layer constituted of the intermediate layer and the superconducting material layer is formed on the metal substrate. When such a superconducting wire is cooled to its critical temperature, a difference in thermal expansion coefficient between the metal substrate and the ceramic layer causes a stress to be applied from the metal substrate to the ceramic layer in the multilayer structure. However, the ceramic layer cannot yield the stress. Therefore, the bonding strength at the interface between the metal substrate and the ceramic layer is decreased, resulting in a problem of occurrence of local peeling at the edges of the ceramic layer. Due to this, in a part of the superconducting material layer, breakage, deformation, or the like is likely to occur, leading to deterioration of the superconducting properties.

An object of the present invention is to provide a superconducting wire having stable superconducting properties, by suppressing local peeling of the superconducting material layer.

Solution to Problem

A superconducting wire according to an aspect of the present invention includes: a substrate having a first main surface and a second main surface located opposite to the first main surface; and a superconducting material layer disposed on the first main surface of the substrate. Along at least a part of the superconducting wire in a direction in which the superconducting wire extends, the superconducting material layer is disposed to cover a side surface of the substrate in a width direction of the substrate and cover at least a part of the second main surface. A thickness of the superconducting material layer located on the first main surface varies along the width direction. A maximum thickness of the superconducting material layer located on the second main surface is smaller than a maximum thickness of the superconducting material layer located on the first main surface.

Advantageous Effects of Invention

According to the foregoing, in the superconducting wire in which the superconducting material layer is formed on the substrate, local peeling of the superconducting material layer can be suppressed. In this way, the superconducting wire having stable superconducting properties can be implemented.

DETAILED DESCRIPTION

Description of Embodiments of the Invention

Figure 1:
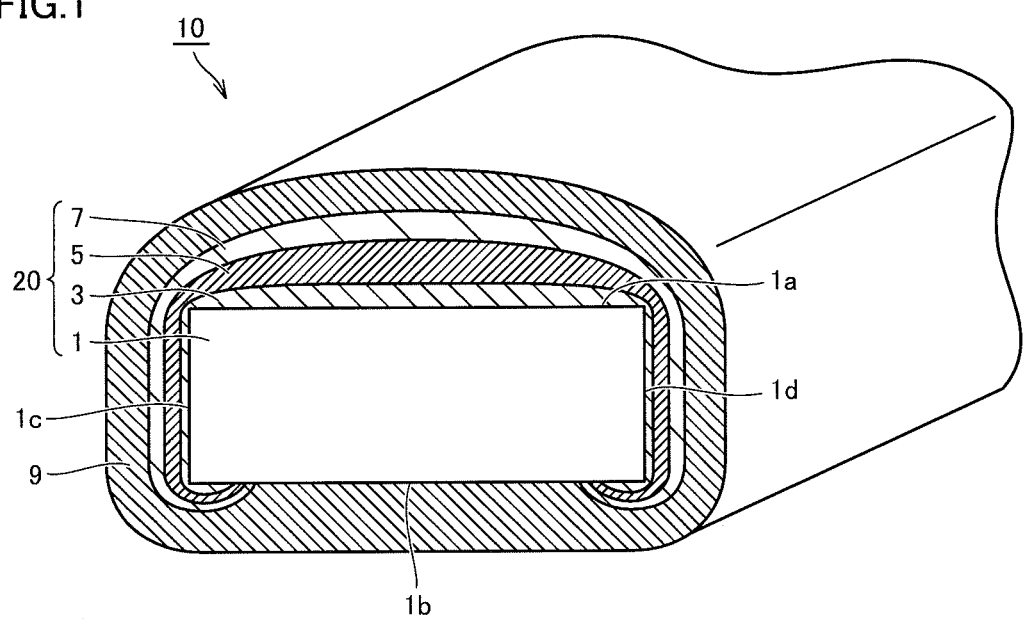
FIG. 1 is a schematic cross-sectional view showing a configuration of a superconducting wire in a first embodiment.

Initially, aspects of the present invention will be described one by one.

(1) A superconducting wire 10 (see FIG. 1) according to an aspect of the present invention includes a substrate 1 and a superconducting material layer 5. Substrate 1 includes a first main surface 1a and a second main surface 1b located opposite to first main surface 1a. Superconducting material layer 5 is disposed on first main surface 1a of substrate 1. Along at least a part of superconducting wire 10 in a direction in which superconducting wire 10 extends, superconducting material layer 5 is disposed to cover a side surface (at least one of a first side surface 1c and a second side surface 1d) of substrate 1 in a width direction of substrate 1 and cover at least a part of second main surface 1b. A thickness of superconducting material layer 5 located on first main surface 1a varies along the width direction. A maximum thickness T2 of superconducting material layer 5 located on second main surface 1b of substrate 1 is smaller than a maximum thickness T1 of superconducting material layer 5 located on first main surface 1a.

Thus, superconducting material layer 5 is formed to cover first main surface 1a of substrate 1, and also cover the side surface(s) of substrate 1 and at least a part of second main surface 1b. At the widthwise ends of substrate 1, the bonding strength between substrate 1 and superconducting material layer 5 can therefore be increased. Accordingly, occurrence of local peeling of superconducting material layer 5 can be suppressed, and therefore, deterioration of the superconducting properties of superconducting wire 10 can be suppressed.

As maximum thickness T2 is smaller than maximum thickness T1, the strength of superconducting material layer 5 located on second main surface 1b is smaller than the strength of superconducting material layer 5 located on first main surface 1a. Accordingly, the possibility increases that superconducting material layer 5 located on second main surface 1b is broken before superconducting material layer 5 located on first main surface 1a is broken due to a stress applied to superconducting material layer 5. Consequently, protection of superconducting material layer 5 located on first main surface 1a from breakage or deformation can be given higher priority, relative to protection of superconducting material layer 5 located on second main surface 1b. Superconducting material layer 5 located on first main surface 1a is a principal portion of a path in which superconducting current flows. As higher priority is given to protection of this portion, deterioration of the superconducting properties of superconducting wire 10 can be suppressed effectively. As a result of this, superconducting wire 10 having stable superconducting properties can be implemented.

(2) Superconducting wire 10 further includes an intermediate layer 3 disposed between first main surface 1a of substrate 1 and superconducting material layer 5. Along at least a part of superconducting wire 10 in the direction in which superconducting wire 10 extends, intermediate layer 3 is disposed to cover the side surface of substrate 1 and cover at least a part of second main surface 1b. A maximum thickness T4 of intermediate layer 3 located on second main surface 1b is smaller than a maximum thickness T3 of intermediate layer 3 located on first main surface 1a (see FIG. 8).

Thus, at the widthwise ends of substrate 1, the bonding strength between substrate 1 and intermediate layer 3 can be increased, and peeling of intermediate layer 3 from substrate 1 can therefore be suppressed. Accordingly, occurrence of peeling of superconducting material layer 5 due to peeling of intermediate layer 3 can be suppressed. As maximum thickness T4 is smaller than maximum thickness T3, the strength of intermediate layer 3 located on second main surface 1b is smaller than the strength of intermediate layer 3 located on first main surface 1a. The possibility thus increases that intermediate layer 3 located on second main surface 1b is broken before intermediate layer 3 located on first main surface 1a is broken, due to a stress applied to intermediate layer 3. Consequently, protection of intermediate layer 3 and superconducting material layer 5 that are located on first main surface 1a from breakage, deformation, or the like can be given higher priority, relative to protection of intermediate layer 3 and superconducting material layer 5 located on second main surface 1b.

(3) Superconducting wire 10 further includes a protective layer 7 formed on superconducting material layer 5. Along at least a part of superconducting wire 10 in the direction in which superconducting wire 10 extends, protective layer 7 is disposed to cover the side surface of substrate 1 and cover at least a part of second main surface 1b. A maximum thickness T6 of protective layer 7 located on second main surface 1b is smaller than a maximum thickness T5 of protective layer 7 located on first main surface 1a.

Thus, protective layer 7 can be formed to cover superconducting material layer 5 which covers the side surface(s) of substrate 1 and covers at least a part of second main surface 1b. It is therefore possible to protect superconducting material layer 5 and contribute to prevention of peeling of superconducting material layer 5. As maximum thickness T6 is smaller than maximum thickness T5, superconducting material layer 5 and protective layer 7 that are located on second main surface 1b are smaller in total thickness and thus smaller in strength than superconducting material layer 5 and protective layer 7 that are located on first main surface 1a. Accordingly, the possibility that superconducting material layer 5 located on second main surface 1b is broken before superconducting material layer 5 located on first main surface 1a is broken is not prohibited.

(4) Regarding superconducting wire 10 (see FIG. 1), the thickness of superconducting material layer 5 located on first main surface 1a varies along the width direction in a manner that the thickness of a central portion of superconducting material layer 5 in the width direction is larger than the thickness of at least one end of superconducting material layer 5 in the width direction. As occurrence of local peeling of superconducting material layer 5 of such superconducting wire 10 can be suppressed as well, deterioration of the superconducting properties of superconducting wire 10 can be suppressed. Consequently, stable superconducting properties can be exhibited.

(5) Regarding superconducting wire 10 (see FIG. 11), the thickness of superconducting material layer 5 located on first main surface 1a varies along the width direction in a manner that the thickness of at least one end of superconducting material layer 5 in the width direction is larger than the thickness of a central portion of superconducting material layer 5 in the width direction. As occurrence of local peeling of superconducting material layer 5 of such superconducting wire 10 can be suppressed as well, deterioration of the superconducting properties of superconducting wire 10 can be suppressed. Consequently, stable superconducting properties can be exhibited.

(6) Regarding superconducting wire 10, along at least a part of superconducting wire 10 in the direction in which superconducting wire 10 extends, superconducting material layer 5 located on one end of second main surface 1b in the width direction is separate from superconducting material layer 5 located on another end of second main surface 1b in the width direction. In other words, one end, in the width direction, of superconducting material layer 5 is formed to extend from over first side surface 1c to over a part of second main surface 1b, and the other end, in the width direction, of superconducting material layer 5 is formed to extend from over second side surface 1d to over a part of second main surface 1b. On second main surface 1b, the two ends of superconducting material layer 5 are separate from each other. As occurrence of local peeling of superconducting material layer 5 of such superconducting wire 10 can be suppressed as well, deterioration of the superconducting properties of superconducting wire 10 can be suppressed. As a result of this, stable superconducting properties can be exhibited.

(7) Regarding superconducting wire 10, superconducting material layer 5 is disposed directly or indirectly on first main surface 1a of substrate 1. The fact that superconducting material layer 5 is disposed indirectly on first main surface 1a herein means that intermediate layer 3 or another layer/other layers are located between first main surface 1a and superconducting material layer 5. In both the case where superconducting material layer 5 is disposed directly on first main surface 1a and the case where superconducting material layer 5 is disposed indirectly on first main surface 1a, the bonding strength between substrate 1 and superconducting material layer 5 can be increased, and therefore, occurrence of local peeling of superconducting material layer 5 can be suppressed.

(8) Regarding superconducting wire 10 (see FIG. 15), first main surface 1a of substrate 1 includes a curved portion. Thus, the surface area of first main surface 1a is larger than that of flat first main surface 1a of substrate 1. It is therefore possible to further increase the bonding strength between first main surface 1a and superconducting material layer 5. Accordingly, the effect of suppressing occurrence of peeling of superconducting material layer 5 can be enhanced.

(9) Regarding superconducting wire 10 (see FIG. 19), the curved portion is located at an end of first main surface 1a of substrate 1 in the width direction of substrate 1. Thus, at the end(s) of first main surface 1a in the width direction, the conformity of contraction of superconducting material layer 5 to contraction of substrate 1 when cooled can be improved. Accordingly, occurrence of peeling of superconducting material layer 5 can be suppressed.

(10) Regarding superconducting wire 10, superconducting material layer 5 is made of an oxide superconducting material. As local peeling of the superconducting material layer can thus be suppressed, an oxide superconducting wire having stable superconducting properties can be implemented.

Details of Embodiments of the Invention

Embodiments of the present invention will be described hereinafter based on the drawings. In the following drawings, the same or corresponding parts are denoted by the same reference numerals, and a description thereof will not be repeated.

First Embodiment

Configuration of Superconducting Wire

FIG. 1 is a schematic cross-sectional view showing a configuration of a superconducting wire in a first embodiment. FIG. 1 shows a cross section in the transverse direction to the direction in which a superconducting wire 10 in the first embodiment extends. Therefore, the direction transverse to the plane of the drawing is the longitudinal direction of the superconducting wire, and superconducting current in a superconducting material layer 5 is to flow in the direction transverse to the plane of the drawing. Moreover, in the schematic cross-sectional views in FIG. 1 and subsequent drawings, the difference between the size in the top-bottom direction (hereinafter also referred to as "thickness direction") and the size in the left-right direction (hereinafter also referred to as "width direction") of the rectangular cross section is shown to be small for the sake of easy recognition of the drawings. However, actually the size in the thickness direction of the cross section is sufficiently smaller than the size in the width direction of the cross section.

Referring to FIG. 1, superconducting wire 10 in the first embodiment has a lengthy shape (tape shape) with a rectangular cross section, and the relatively larger surfaces of the wire extending in the longitudinal direction of the lengthy shape are herein defined as main surfaces. Superconducting wire 10 includes a substrate 1, an intermediate layer 3, a superconducting material layer 5, a protective layer 7, and a stabilizing layer 9.

Substrate 1 has a first main surface 1a and a second main surface 1b. Second main surface 1b is located opposite to first main surface 1a. Substrate 1 further has a first side surface 1c and a second side surface 1d opposite to first side surface 1c. Preferably, substrate 1 is made of a metal for example and has a lengthy shape (tape shape) with a rectangular cross section. For the superconducting wire to be wound in a coil shape, preferably substrate 1 extends for a long distance of approximately 2 km.

More preferably, an orientation-aligned metal substrate is used as substrate 1. The orientation-aligned metal substrate means a substrate in which crystal orientations are aligned in two axis directions in a plane of the substrate surface. For the orientation-aligned metal substrate, preferably an alloy of at least two metals selected from nickel (Ni), copper (Cu), chromium (Cr), manganese (Mn), cobalt (Co), iron (Fe), palladium (Pd), silver (Ag), and gold (Au), for example, is used. These metals and another metal or alloy may be stacked together. For example, an alloy such as SUS which is a high-strength material may also be used. The material for substrate 1 is not limited to the aforementioned ones, and any material other than the metal, for example, may also be used.

Superconducting wire 10 has a size in the width direction of approximately 4 mm to 10 mm, for example. In order to increase the density of current flowing in superconducting wire 10, a smaller cross-sectional area of substrate 1 is preferred. However, an excessively thin thickness (in the top-bottom direction in FIG. 1) of substrate 1 may result in deterioration of the strength of substrate 1. Therefore, the thickness of substrate 1 is preferably about 0.1 mm.

Intermediate layer 3 is formed on first main surface 1a of substrate 1. Superconducting material layer 5 is formed on the main surface (upper main surface in FIG. 1) of intermediate layer 3 opposite to the main surface thereof facing substrate 1. Namely, superconducting material layer 5 is disposed on first main surface 1a of substrate 1 with intermediate layer 3 between superconducting material layer 5 and substrate 1. The material forming intermediate layer 3 is preferably yttria-stabilized zirconia (YSZ), cerium oxide ($CeO_2$), magnesium oxide (MgO), yttrium oxide ($Y_2O_3$), or strontium titanate ($SrTiO_3$), for example. These materials have an extremely low reactivity with superconducting material layer 5 and do not deteriorate the superconducting properties of superconducting material layer 5 even at the boundary abutting on superconducting material layer 5. Particularly in the case where a metal is used as a material forming substrate 1, the intermediate layer can perform a function of alleviating difference in orientation alignment between superconducting material layer 5 and substrate 1 having crystal orientation alignment in its surface to thereby prevent metal atoms from escaping from substrate 1 into superconducting material layer 5 during formation of superconducting material layer 5 at a high temperature. The material forming intermediate layer 3 is not particularly limited to the aforementioned ones.

Intermediate layer 3 may be made up of a plurality of layers. In the case where intermediate layer 3 is made up of a plurality of layers, the layers constituting intermediate layer 3 may be formed of respective materials different from each other, or some of the layers constituting intermediate layer 3 may be made of the same material.

Superconducting material layer 5 is a thin-film layer in superconducting wire 10, and superconducting current flows in this superconducting material layer 5. While the superconducting material is not particularly limited, the superconducting material is preferably an RE-123-based oxide superconductor, for example. RE-123-based oxide superconductor means a superconductor represented by $REBa_2Cu_3O_y$, (y is 6 to 8, more preferably 6.8 to 7, and RE represents yttrium or rare-earth element such as Gd, Sm, Ho, or the like). In order to improve the magnitude of the superconducting current flowing in superconducting material layer 5, superconducting material layer 5 preferably has a thickness of 0.5 µm to 10 µm.

Protective layer 7 is formed on the main surface (upper main surface in FIG. 1) of superconducting material layer 5 opposite to the main surface thereof facing intermediate layer 3. Preferably, protective layer 7 is made for example of silver (Ag) or silver alloy, and has a thickness of not less than 0.1 µm and not more than 50 µm.

Above-described substrate 1, intermediate layer 3, superconducting material layer 5, and protective layer 7 constitute a multilayer stack 20. Stabilizing layer 9 is disposed to cover the periphery of multilayer stack 20. In the present embodiment, stabilizing layer 9 is disposed to cover the outer periphery of multilayer stack 20, namely cover substantially the whole outermost surface of multilayer stack 20. It should be noted that "periphery of the multilayer stack" of the present invention is not limited to the whole periphery and may be only a main surface of the multilayer stack.

Stabilizing layer 9 is formed of a highly conductive metal foil or plating layer, or the like. Stabilizing layer 9 functions as a bypass together with protective layer 7 for commutation of the current in superconducting material layer 5 when transition of superconducting material layer 5 from the superconducting state to the normal conducting state occurs. The material forming stabilizing layer 9 is preferably copper (Cu), or copper alloy or the like, for example. While the thickness of stabilizing layer 9 is not particularly limited, the thickness is preferably 10 µm to 500 µm for physically protecting protective layer 7 and superconducting material layer 5.

Figure 2:
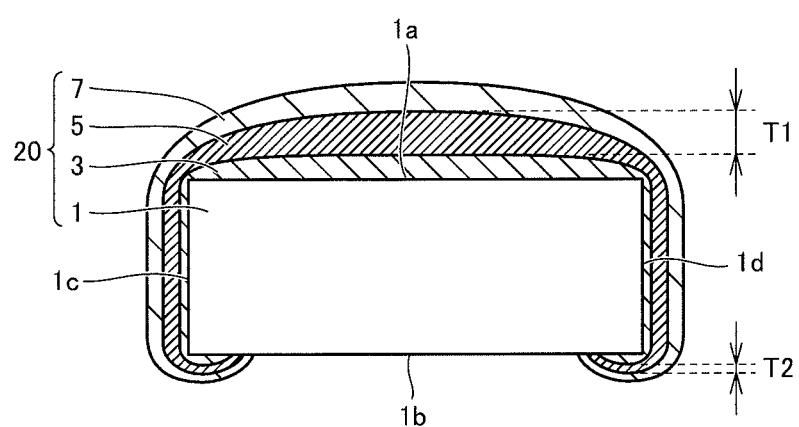
FIG. 2 is a schematic cross-sectional view showing a configuration of a multilayer stack in the first embodiment.

FIG. 2 is a schematic cross-sectional view showing a configuration of multilayer stack 20 in the first embodiment. FIG. 2 shows a cross section in the transverse direction to the direction in which superconducting wire 10 in the first embodiment extends.

In multilayer stack 20 in the first embodiment, superconducting material layer 5 is disposed to cover the side surface(s) of substrate 1 in the width direction (left-right direction in FIG. 2) and cover at least a part of second main surface 1b.

Specifically, in multilayer stack 20 shown in FIG. 2, one end, in the width direction, of superconducting material layer 5 is formed to extend from over first side surface 1c to over a part of second main surface 1b, and the other end, in the width direction, of superconducting material layer 5 is formed to extend from over second side surface 1d to over a part of second main surface 1b. The two ends of superconducting material layer 5 are separate from each other on second main surface 1b. In other words, superconducting material layer 5 is disposed to entirely cover first main surface 1a and side surfaces 1c, 1d of substrate 1 and partially cover second main surface 1b.

This configuration enables the bonding strength between substrate 1 and superconducting material layer 5 to be increased, as compared with a conventional superconducting wire in which superconducting material layer 5 covers only first main surface 1a of substrate 1.

Details are as follows. When a superconducting wire in which a superconducting material layer which is a ceramic layer is formed on a metal substrate is cooled to its critical temperature, a stress is generated between the metal substrate and the superconducting material layer due to a difference in thermal expansion coefficient between the metal and the ceramic material. Specifically, as the superconducting wire is cooled, each layer in the wire is contracted. At this time, because the superconducting material layer is smaller in thermal expansion coefficient than the metal substrate, the superconducting material layer cannot contract to the same extent as the metal substrate and is accordingly subjected to the stress. Consequently, in the conventional superconducting wire, the superconducting material layer could be peeled off particularly at the widthwise ends of the substrate.

In a superconducting wire in which an intermediate layer is located between the substrate and the superconducting material layer as well, the intermediate layer which is a ceramic layer could be peeled off from an end, in the width direction, of the substrate, like the superconducting material layer as described above. Occurrence of peeling of the superconducting material layer or the intermediate layer makes it more likely that the superconducting material layer is broken or deformed, for example, which could result in deterioration of the superconducting properties.

In superconducting wire 10 in the first embodiment, superconducting material layer 5 extends from over side surfaces 1c, 1d of substrate 1 to over at least a part of second main surface 1b. Thus, as compared with the conventional superconducting wire, the bonding area between substrate 1 and superconducting material layer 5 can be increased and the bonding strength between substrate 1 and superconducting material layer 5 can therefore be enhanced. Accordingly, when superconducting wire 10 is cooled, the conformity of contraction of superconducting material layer 5 to contraction of substrate 1 is improved. Peeling of superconducting material layer 5 from substrate 1 can therefore be suppressed. As a result of this, superconducting material layer 5 can be prevented from being broken or deformed, and deterioration of the superconducting properties of superconducting wire 10 can therefore be suppressed.

In multilayer stack 20 shown in FIG. 2, intermediate layer 3 is disposed to entirely cover first main surface 1a and side surfaces 1c, 1d of substrate 1 and partially cover second main surface 1b. Thus, like the bonding strength between substrate 1 and superconducting material layer 5, the bonding strength between substrate 1 and intermediate layer 3 can be increased. Peeling of intermediate layer 3 from substrate 1 can therefore be suppressed. Accordingly, occurrence of peeling of superconducting material layer 5 due to peeling of intermediate layer 3 can be suppressed. Preferably, superconducting material layer 5 covers the ends, in the width direction, of intermediate layer 3 as shown in FIG. 2. Accordingly, the effect of suppressing peeling of intermediate layer 3 can be enhanced.

In multilayer stack 20 shown in FIG. 2, protective layer 7 is disposed to entirely cover first main surface 1a and side surfaces 1c, 1d of substrate 1 and partially cover second main surface 1b. Thus, protective layer 7 can be formed to cover superconducting material layer 5 which covers side surfaces 1c, 1d and second main surface 1b of substrate 1. Protective layer 7 thus protects superconducting material layer 5 and can contribute to prevention of peeling of superconducting material layer 5. Preferably, protective layer 7 covers the ends, in the width direction, of superconducting material layer 5 as shown in FIG. 2. Accordingly, the effect of suppressing peeling of superconducting material layer 5 can be enhanced.

As long as superconducting material layer 5, intermediate layer 3 and protective layer 7 in superconducting wire 10 in the first embodiment cover at least a part of second main surface 1b along at least a part of superconducting wire 10 in the direction in which superconducting wire 10 extends (longitudinal direction), the bonding strength between substrate 1 and superconducting material layer 5 and intermediate layer 3 can be enhanced.

In multilayer stack 20 shown in FIG. 2, intermediate layer 3, superconducting material layer 5 and protective layer 7 that are located on first main surface 1a each have a cross-sectional shape protruding at its central portion in the width direction. Specifically, intermediate layer 3, superconducting material layer 5 and protective layer 7 each have an upper surface in an outwardly curved convex shape. Accordingly, intermediate layer 3, superconducting material layer 5 and protective layer 7 that are located on first main surface 1a each have a thickness varying along the width direction. In the example in FIG. 2, the apex of this curve is located substantially at the center, in the width direction, of the upper surface. Each of intermediate layer 3, superconducting material layer 5 and protective layer 7 therefore has the thickness at its central portion in the width direction larger than the thickness at its end in the width direction.

In multilayer stack 20, a maximum thickness T2 of superconducting material layer 5 located on second main surface 1b is smaller than a maximum thickness T1 of superconducting material layer 5 located on first main surface 1a (T2<T1).

As T2 is smaller T1, the strength of superconducting material layer 5 located on second main surface 1b is smaller than the strength of superconducting material layer 5 located on first main surface 1a. Therefore, when superconducting material layer 5 is subjected to a stress applied from substrate 1, there is a high possibility that superconducting material layer 5 located on second main surface 1b is broken before superconducting material layer 5 located on first main surface 1a is broken. As a result of this, protection of superconducting material layer 5 located on first main surface 1a from the stress applied to superconducting material layer 5 is given higher priority. Since superconducting material layer 5 located on first main surface 1a is a principal portion of the path in which superconducting current flows, protection of this portion can be given higher priority to effectively suppress deterioration of the superconducting properties.

If T2 is extremely smaller than T1, there arises a possibility that a sufficient bonding strength cannot be maintained between second main surface 1b and superconducting material layer 5. In view of this, preferably the ratio of T2 to T1 (T2/T1) is 0.1% or more and 95% or less. When this ratio is 95% or less, it is ensured that the strength of superconducting material layer 5 located on second main surface 1b is smaller than the strength of superconducting material layer 5 located on first main surface 1a, and therefore, the above-described effect can be produced adequately. In contrast, when this ratio is less than 0.1%, a sufficient bonding strength between substrate 1 and superconducting material layer 5 located on second main surface 1b cannot be maintained, and there arises a possibility that the above-described effect cannot be produced adequately.

Figure 3:
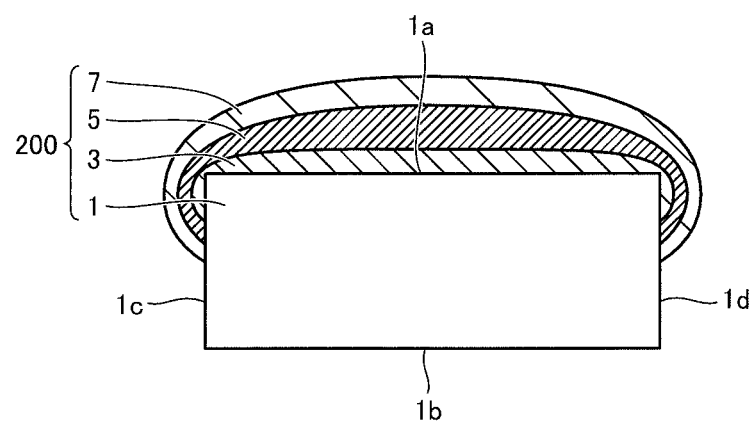
FIG. 3 is a schematic cross-sectional view showing a configuration of a multilayer stack of a superconducting wire in a comparative example.

Further, superconducting wire 10 in the first embodiment can produce advantageous effects over a comparative example shown in FIG. 3. FIG. 3 is a schematic cross-sectional view showing a configuration of a multilayer stack of a superconducting wire in a comparative example. FIG. 3 shows a cross section of the superconducting wire in the comparative example in the transverse direction to the direction in which the superconducting wire extends.

Referring to FIG. 3, a multilayer stack 200 in the comparative example is basically similar in configuration to multilayer stack 20 shown in FIG. 2. Multilayer stack 200, however, differs from multilayer stack 20 shown in FIG. 2 in that the former includes an intermediate layer 3, a superconducting material layer 5 and protective layer 7 that are disposed to cover a first main surface 1a of substrate 1 and partially cover side surfaces 1c, 1d of substrate 1.

In other words, regarding multilayer stack 200, superconducting material layer 5 and intermediate layer 3 do not extend to over second main surface 1b. Therefore, as compared with multilayer stack 200, multilayer stack 20 shown in FIG. 2 is larger in both the bonding area between substrate 1 and superconducting material layer 5 and the bonding area between substrate 1 and intermediate layer 3.

When cooled, substrate 1 will contract not only in the width direction but also in the thickness direction. In multilayer stack 20 shown in FIG. 2, superconducting material layer 5 and intermediate layer 3 extend to over second main surface 1b, and therefore, the conformity to not only contraction in the width direction but also contraction in the thickness direction will be high. In contrast, regarding multilayer stack 200, although the conformity to contraction in the width direction of substrate 1 can be provided by superconducting material layer 5 and intermediate layer 3 located on side surfaces 1c, 1d, the conformity to contraction in the thickness direction of substrate 1 will be low.

Further, in a cross section of multilayer stack 20 shown in FIG. 2, the widthwise end portions of superconducting material layer 5 are each in a U shape. Therefore, the widthwise end portions of superconducting material layer 5 are substantially in the state of catching second main surface 1b. In this state, the end portions serve as hooks for securing superconducting material layer 5 to substrate 1 in terms of the structure. As a result of this, the structure having a higher resistance to the stress from substrate 1, as compared with the comparative example, can be implemented.

For the foregoing reasons, superconducting wire 10 in the first embodiment can produce a higher effect of suppressing peeling of superconducting material layer 5 and/or intermediate layer 3 from substrate 1, as compared with the superconducting wire in the comparative example.

In the first embodiment, intermediate layer 3 and superconducting material layer 5 that cover the side surface(s) of substrate 1 and cover at least a part of second main surface 1b may each be formed to cover both first side surface 1c and second side surface 1d as shown in FIGS. 1 and 2, or formed to cover only one of first side surface 1c and second side surface 1d. In other words, intermediate layer 3 and superconducting material layer 5 may be disposed to cover at least one of first side surface 1c and second side surface 1d and cover at least a part of second main surface 1b. Both these configurations enable increase of the bonding strength between substrate 1, intermediate layer 3 and superconducting material layer 5, as compared with the conventional superconducting wire and the comparative example (FIG. 3).

Method of Manufacturing Superconducting Wire

Next, referring to FIGS. 4 to 8, a method of manufacturing the superconducting wire in the first embodiment is described.

Figure 4:
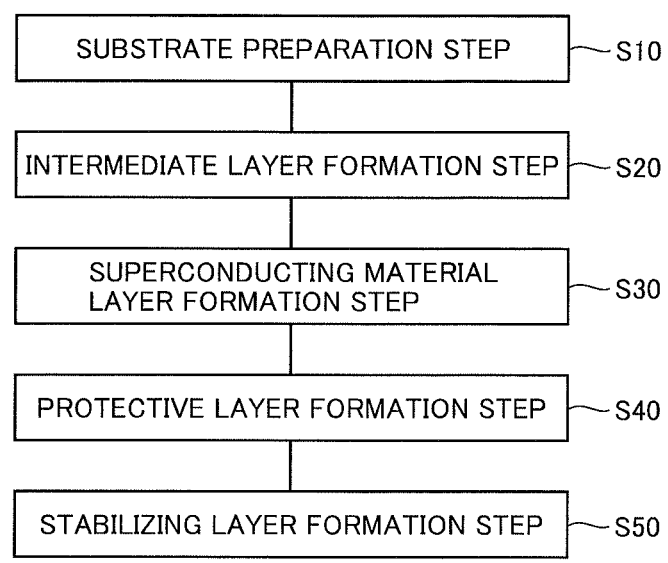
FIG. 4 is a flowchart showing a method of manufacturing the superconducting wire in the first embodiment.
Figure 5:
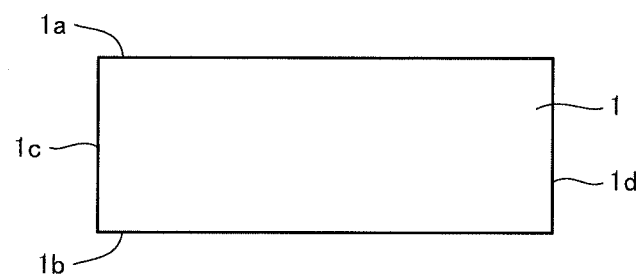
FIG. 5 is a schematic cross-sectional view for illustrating the method of manufacturing the superconducting wire in the first embodiment.
Figure 6:
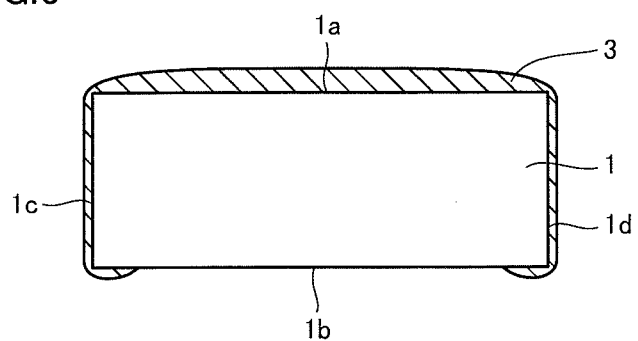
FIG. 6 is a schematic cross-sectional view for illustrating the method of manufacturing the superconducting wire in the first embodiment.
Figure 7:
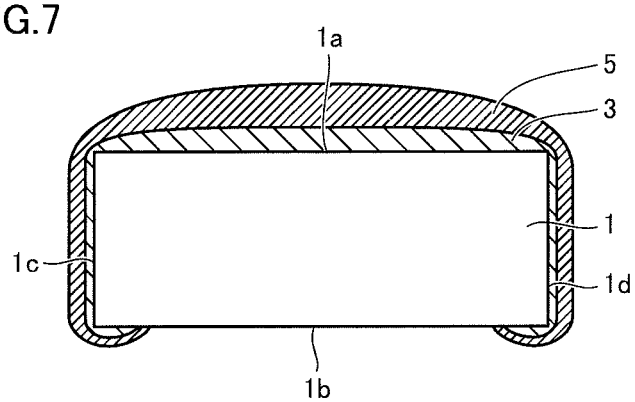
FIG. 7 is a schematic cross-sectional view for illustrating the method of manufacturing the superconducting wire in the first embodiment.

FIG. 4 is a flowchart showing a method of manufacturing the superconducting wire in the first embodiment. In the following, the present embodiment is described in connection with a method of manufacturing superconducting wire 10 using a substrate 1 having been subjected to wire thinning to have a width of 4 mm, by way of example.

Referring to FIG. 4, initially a substrate preparation step (S10) is performed. Specifically, referring to FIG. 5, a substrate 1 formed of an orientation-aligned metal substrate and having a tape shape with a desired width (width: 4 mm, for example) is prepared. Substrate 1 has a first main surface 1a and a second main surface 1b located opposite to first main surface 1a, as well as a first side surface 1c and a second side surface 1d opposite to first side surface 1c. The thickness of substrate 1 may be adjusted appropriately to meet any purpose, and can be usually in a range of 10 μm to 500 μm. For example, the thickness of substrate 1 is approximately 100 μm.

Next, an intermediate layer formation step (S20 in FIG. 4) of forming an intermediate layer 3 on substrate 1 is performed. Specifically, referring to FIG. 6, intermediate layer 3 is formed on first main surface 1a of substrate 1. As the method of forming intermediate layer 3, any method may be used. For example, a physical vapor deposition method such as pulsed laser deposition (PLD) method may be used.

Next, a superconducting material layer formation step (S30 in FIG. 4) of forming a superconducting material layer 5 on intermediate layer 3 is performed. Specifically, referring to FIG. 7, superconducting material layer 5 made of an RE-123-based oxide superconductor is formed on the main surface (upper main surface in FIG. 7) of intermediate layer 3 opposite to the main surface thereof facing substrate 1. As the method of forming superconducting material layer 5, any method may be used. For example, a vapor phase method, a liquid phase method, or a combination of them may be used to form the layer. Examples of the vapor phase method are laser vapor deposition method, sputtering method, electron beam vapor deposition method, and the like. This step can be performed by at least one of laser vapor deposition method, sputtering method, electron beam method, and organic metal deposition method to form superconducting material layer 5 having its surface which is excellent in crystal orientation alignment and surface smoothness.

Next, a protective layer formation step (S40 in FIG. 4) of forming a protective layer 7 on superconducting material layer 5 is performed. Specifically, referring to FIG. 8, protective layer 7 made of silver (Ag) or silver alloy is formed on the main surface (upper main surface in FIG. 8) of superconducting material layer 5 opposite to the main surface thereof facing intermediate layer 3, by a physical vapor deposition method such as sputtering, electroplating method, or the like, for example. Protective layer 7 can be formed to protect the surface of superconducting material layer 5. After this, oxygen annealing, namely heating in an oxygen ambient (oxygen introduction step) is performed to introduce oxygen into superconducting material layer 5. Through the above-described steps, a multilayer stack 20 having a size in the width direction of approximately 30 mm is formed.

Next, a stabilizing layer formation step (S50 in FIG. 4) of forming a stabilizing layer 9 on the periphery of multilayer stack 20 is performed. Specifically, stabilizing layer 9 made of copper (Cu) or copper alloy is formed through the known plating to cover the outer periphery of multilayer stack 20, namely to cover substantially the whole outermost surface of multilayer stack 20. The method of forming stabilizing layer 9 may be bonding of copper foil other than the plating. Through the above-described steps, superconducting wire 10 in the first embodiment shown in FIG. 1 is manufactured.

Figure 8:
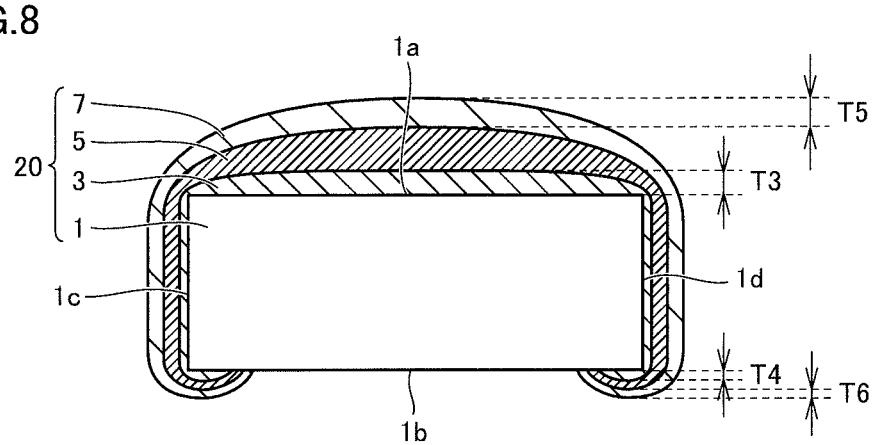
FIG. 8 is a schematic cross-sectional view for illustrating the method of manufacturing the superconducting wire in the first embodiment.

In multilayer stack 20 shown in FIG. 8, preferably a maximum thickness T4 of intermediate layer 3 located on second main surface 1b is smaller than a maximum thickness T3 of intermediate layer 3 located on first main surface 1a (T4<T3).

As T4 is smaller than T3, the strength of intermediate layer 3 located on second main surface 1b is smaller than the strength of intermediate layer 3 located on first main surface 1a. Therefore, when intermediate layer 3 is subjected to a stress applied from substrate 1, the possibility increases that intermediate layer 3 located on second main surface 1b is broken before intermediate layer 3 located on first main surface 1a is broken. Accordingly, protection of intermediate layer 3 located on first main surface 1a from the stress applied to intermediate layer 3 is given higher priority. Consequently, protection of superconducting material layer 5 located on first main surface 1a from breakage or deformation for example can be given higher priority.

In multilayer stack 20, preferably a maximum thickness T6 of protective layer 7 located on second main surface 1b is smaller than a maximum thickness T5 of protective layer 7 located on first main surface 1a (T6<T5).

As T6 is smaller than T5, intermediate layer 3, superconducting material layer 5 and protective layer 7 that are located on second main surface 1b are smaller in total thickness and therefore smaller in strength than intermediate layer 3, superconducting material layer 5 and protective layer 7 that are located on first main surface 1a. Accordingly, the possibility that superconducting material layer 5 located on second main surface 1b is broken before superconducting material layer 5 located on first main surface 1a is broken is not prohibited.

Modification of First Embodiment

Figure 9:
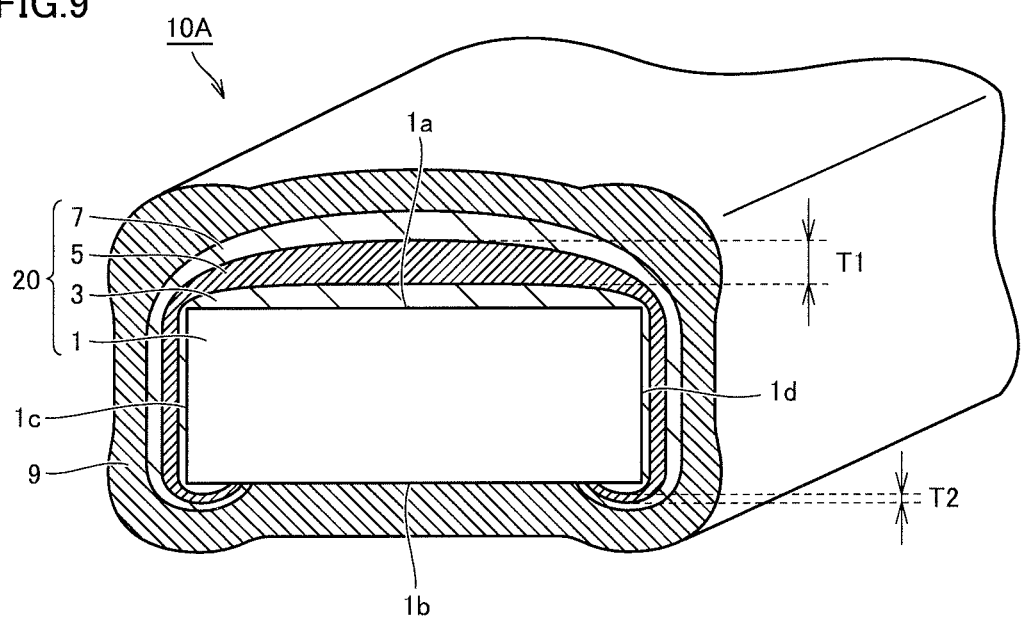
FIG. 9 is a schematic cross-sectional view showing a configuration of a superconducting wire according to a first modification in the first embodiment.
Figure 10:
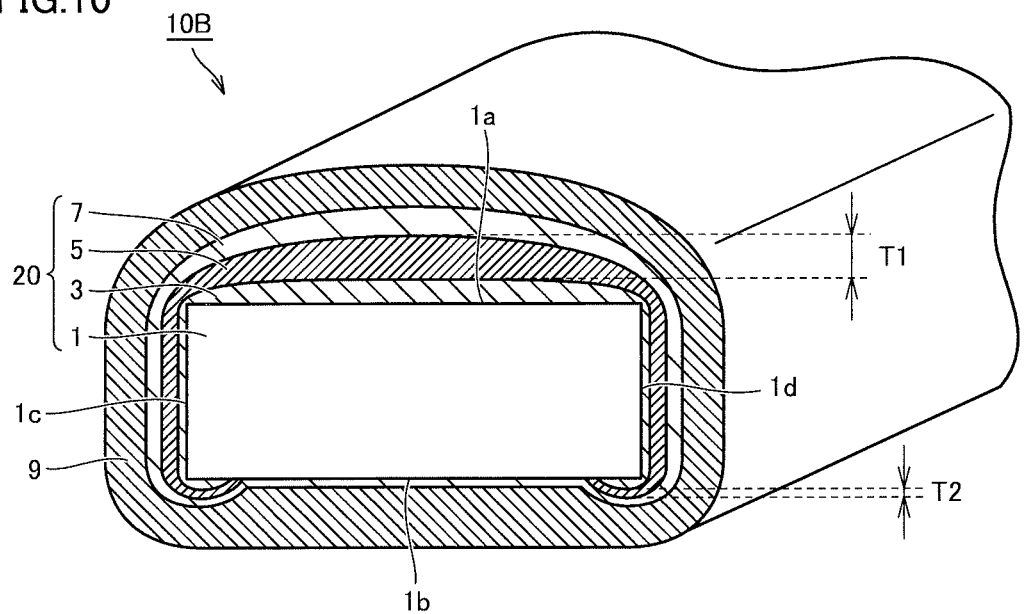
FIG. 10 is a schematic cross-sectional view showing a configuration of a superconducting wire according to a second modification in the first embodiment.

Referring to FIGS. 9 and 10, modifications of the superconducting wire in the first embodiment are described.

FIG. 9 is a schematic cross-sectional view showing a configuration of a superconducting wire 10A according to a first modification in the first embodiment. FIG. 9 shows a cross section in the transverse direction to the direction in which superconducting wire 10A extends.

Referring to FIG. 9, basically superconducting wire 10A of the first modification has a similar structure to superconducting wire 10 shown in FIG. 1, except that the shape of a stabilizing layer 9 of superconducting wire 10A differs from that of superconducting wire 10.

In superconducting wire 10A, the thickness of stabilizing layer 9 located at the widthwise ends of first main surface 1a of substrate 1 is larger than the thickness of stabilizing layer 9 located above a widthwise central portion of first main surface 1a. The thickness of stabilizing layer 9 located at the widthwise ends of second main surface 1b of substrate 1 is also larger than the thickness of stabilizing layer 9 located above a widthwise central portion of second main surface 1b.

In superconducting wire 10A, intermediate layer 3 and superconducting material layer 5 are also formed to extend from over side surfaces 1c, 1d of substrate 1 to over a part of second main surface 1b. Maximum thickness T2 of superconducting material layer 5 located on second main surface 1b is smaller than maximum thickness T1 of superconducting material layer 5 located on first main surface 1a. Further, respective maximum thicknesses of intermediate layer 3 and protective layer 7 that are located on second main surface 1b are smaller than respective maximum thicknesses of intermediate layer 3 and protective layer 7 that are located on first main surface 1a, respectively. Superconducting wire 10A can therefore produce similar effects to those of superconducting wire 10 shown in FIG. 1.

Basically a method of manufacturing superconducting wire 10A has similar features to those of the method of manufacturing the superconducting wire in the first embodiment described above based on FIGS. 4 to 8, except that the conditions for forming the stabilizing layer in the stabilizing layer formation step (S50 in FIG. 4) of the former method differ from those of the first embodiment. For example, when the electroplating method is used to form stabilizing layer 9 to cover the outer periphery of multilayer stack 20 with stabilizing layer 9, current is likely to concentrate on the corners of multilayer stack 20. As a result, the plating layer covering the corners is relatively thicker. Stabilizing layer 9 shown in FIG. 9 can thus be formed. In this way, superconducting wire 10A is obtained.

FIG. 10 is a schematic cross-sectional view showing a configuration of a superconducting wire 10B according to a second modification in the first embodiment. FIG. 10 shows a cross section in the transverse direction to the direction in which superconducting wire 10B extends.

Referring to FIG. 10, basically superconducting wire 10B of the second modification has a similar structure to superconducting wire 10 shown in FIG. 1, except that the structure of multilayer stack 20 differs from that of multilayer stack 20 shown in FIG. 2.

In superconducting wire 10B, protective layer 7 located on second main surface 1b is disposed to entirely cover second main surface 1b. In superconducting wire 10B, intermediate layer 3 and superconducting material layer 5 are also formed to extend from over side surfaces 1c, 1d of substrate 1 to over a part of second main surface 1b. Maximum thickness T2 of superconducting material layer 5 located on second main surface 1b is smaller than maximum thickness T1 of superconducting material layer 5 located on first main surface 1a. Further, respective maximum thicknesses of intermediate layer 3 and protective layer 7 that are located on second main surface 1b are smaller than respective maximum thicknesses of intermediate layer 3 and protective layer 7 that are located on first main surface 1a, respectively. Superconducting wire 10B can therefore produce similar effects to those of superconducting wire 10 shown in FIG. 1.

Basically a method of manufacturing superconducting wire 10B has similar features to those of the method of manufacturing the superconducting wire in the first embodiment described above based on FIGS. 4 to 8, except that the conditions for forming the protective layer in the protective layer formation step (S40 in FIG. 4, FIG. 8) of the former method differ from those of the first embodiment. For example, when the electroplating method is used to form protective layer 7 on the main surface of superconducting material layer 5 opposite to the main surface thereof facing intermediate layer 3, second main surface 1b can be entirely plated to form protective layer 7 shown in FIG. 10. In this way, superconducting wire 10B is obtained.

In the modifications shown in FIGS. 9 and 10 as well, as long as superconducting material layer 5 covers a part of second main surface 1b along at least a part of the superconducting wire in the longitudinal direction, the bonding strength between substrate 1 and superconducting material layer 5 can be increased. Intermediate layer 3 may cover a part of second main surface 1b and protective layer 7 may cover at least a part of second main surface 1b along at least a part of the superconducting wire in the longitudinal direction.

Second Embodiment

Figure 11:
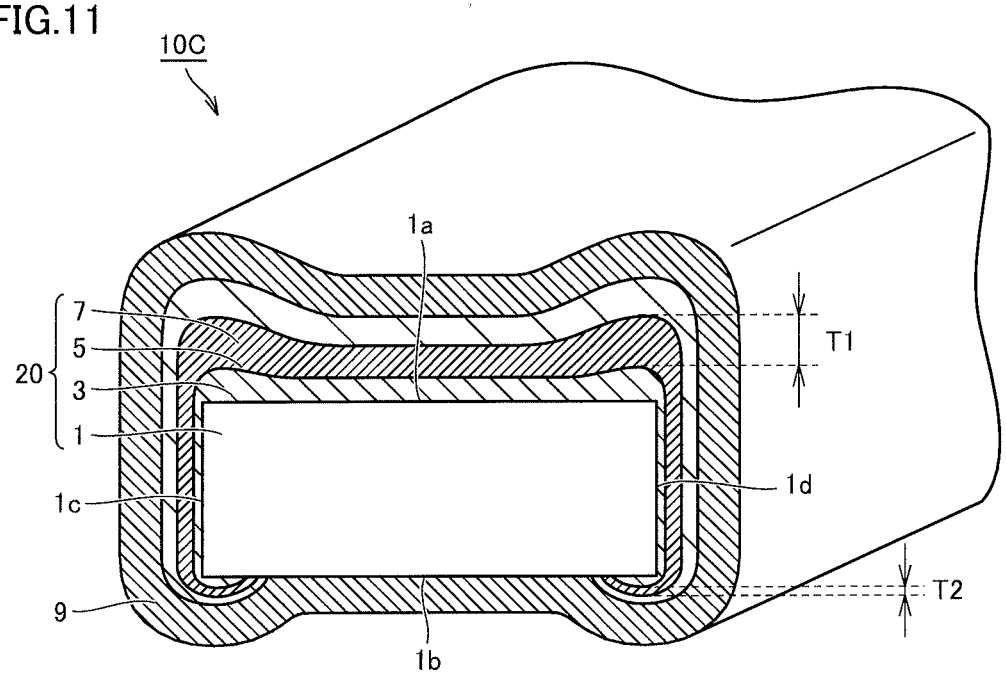
FIG. 11 is a schematic cross-sectional view showing a configuration of a superconducting wire in a second embodiment.

FIG. 11 is a schematic cross-sectional view showing a configuration of a superconducting wire 10C in a second embodiment. FIG. 11 shows a cross section in the transverse direction to the direction in which superconducting wire 10C extends.

Referring to FIG. 11, basically superconducting wire 10C in the second embodiment has a similar structure to superconducting wire 10 shown in FIG. 1, except that the structure of multilayer stack 20 differs from that of multilayer stack 20 shown in FIG. 2.

In superconducting wire 10C, intermediate layer 3, superconducting material layer 5 and protective layer 7 that are located on first main surface 1a each protrude at the opposite ends in the width direction, and accordingly have a cross section whose central portion in the width direction recedes toward substrate 1. In other words, the upper surface of each of intermediate layer 3, superconducting material layer 5 and protective layer 7 has a concave shape curved toward substrate 1. Thus the thickness of each of intermediate layer 3, superconducting material layer 5 and protective layer 7 that are located on first main surface 1a varies along the width direction. In the example in FIG. 11, the thickness at the ends, in the width direction, of each of intermediate layer 3, superconducting material layer 5 and protective layer 7 is larger than the thickness at the central portion in the width direction.

In superconducting wire 10C, maximum thickness T2 of superconducting material layer 5 located on second main surface 1b is also smaller than maximum thickness T1 of superconducting material layer 5 located on first main surface 1a. Respective maximum thicknesses of intermediate layer 3 and protective layer 7 that are located on second main surface 1b are smaller than respective maximum thicknesses of intermediate layer 3 and protective layer 7 that are located on first main surface 1a, respectively. Superconducting wire 10C can therefore produce similar effects to those of superconducting wire 10 shown in FIG. 1.

Basically a method of manufacturing superconducting wire 10C has similar features to those of the method of manufacturing the superconducting wire in the first embodiment described above based on FIGS. 4 to 8, except that the conditions for forming the layers in the intermediate layer formation step (S20 in FIG. 4, FIG. 6), the superconducting material layer formation step (S30 in FIG. 4, FIG. 7), and the protective layer formation step (S40 in FIG. 4, FIG. 8) differ from those in the first embodiment.

Third Embodiment

Figure 12:
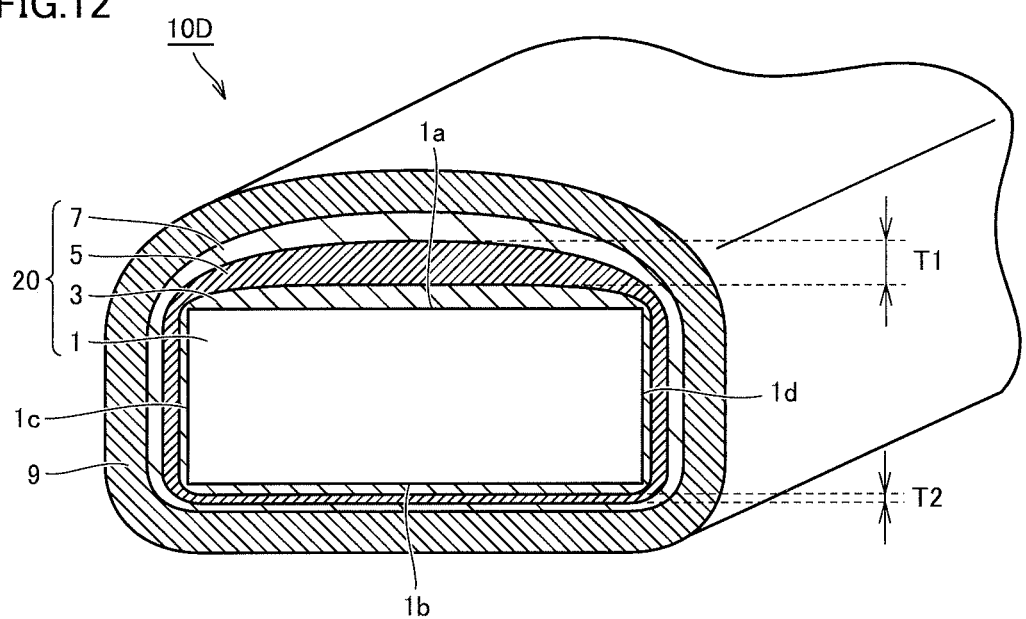
FIG. 12 is a schematic cross-sectional view showing a configuration of a superconducting wire in a third embodiment.

FIG. 12 is a schematic cross-sectional view showing a configuration of a superconducting wire 10D in a third embodiment. FIG. 12 shows a cross section in the transverse direction to the direction in which superconducting wire 10D extends.

Referring to FIG. 12, basically superconducting wire 10D of the third embodiment has a similar structure to superconducting wire 10 shown in FIG. 1, except that the structure of multilayer stack 20 differs from that of multilayer stack 20 shown in FIG. 2.

In superconducting wire 10D, intermediate layer 3, superconducting material layer 5 and protective layer 7 that are located on second main surface 1b are each disposed to entirely cover second main surface 1b. In superconducting wire 10D, maximum thickness T2 of superconducting material layer 5 located on second main surface 1b is also smaller than maximum thickness T1 of superconducting material layer 5 located on first main surface 1a. Respective maximum thicknesses of intermediate layer 3 and protective layer 7 that are located on second main surface 1b are also smaller than respective maximum thicknesses of intermediate layer 3 and protective layer 7 that are located on first main surface 1a, respectively. Superconducting wire 10D can therefore produce similar effects to those of superconducting wire 10 shown in FIG. 1.

As long as superconducting material layer 5 entirely covers second main surface 1b along at least a part of superconducting wire 10D in the longitudinal direction, the bonding strength between substrate 1 and superconducting material layer 5 can be increased. Intermediate layer 3 may entirely cover second main surface 1b and protective layer 7 may entirely cover second main surface 1b along at least a part of superconducting wire 10D in the longitudinal direction.

Basically a method of manufacturing superconducting wire 10D has similar features to those of the method of manufacturing the superconducting wire in the first embodiment described above based on FIGS. 4 to 8, except that the conditions for forming layers in the intermediate layer formation step (S20 in FIG. 4, FIG. 6), the superconducting material layer formation step (S30 in FIG. 4, FIG. 7), and the protective layer formation step (S40 in FIG. 4, FIG. 8) differ from those in the first embodiment.

Fourth Embodiment

Figure 13:
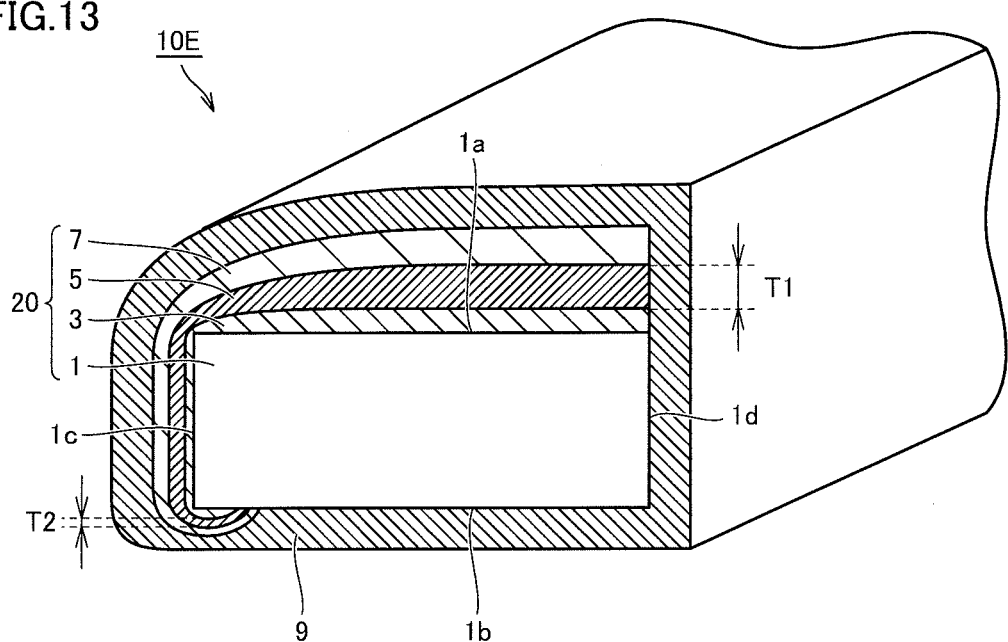
FIG. 13 is a schematic cross-sectional view showing a configuration of a superconducting wire in a fourth embodiment.

FIG. 13 is a schematic cross-sectional view showing a configuration of a multilayer stack in a superconducting wire 10E in a fourth embodiment. FIG. 13 shows a cross section in the transverse direction to the direction in which superconducting wire 10E extends.

Referring to FIG. 13, basically superconducting wire 10E in the fourth embodiment has a similar structure to superconducting wire 10 shown in FIG. 1, except that the structure of multilayer stack 20 differs from that of multilayer stack 20 shown in FIG. 2.

In superconducting wire 10E, intermediate layer 3, superconducting material layer 5 and protective layer 7 are disposed to entirely cover first main surface 1a and first side surface 1c of substrate 1, and partially cover second main surface 1b. In contrast, second side surface 1d of substrate 1 is not covered by intermediate layer 3, superconducting material layer 5 and protective layer 7.

In superconducting wire 10E, intermediate layer 3, superconducting material layer 5 and protective layer 7 that are located on first main surface 1a each protrude at one end in the width direction. In other words, respective upper surfaces of intermediate layer 3, superconducting material layer 5 and protective layer 7 each have an outwardly curved convex shape. Therefore, intermediate layer 3, superconducting material layer 5 and protective layer 7 that are located on first main surface 1a each have a thickness varying along the width direction. In the example shown in FIG. 13, intermediate layer 3, superconducting material layer 5 and protective layer 7 each have a thickness at one end in the width direction that is larger than its thickness at the other end in the width direction.

In superconducting wire 10E, maximum thickness T2 of superconducting material layer 5 located on second main surface 1b is also smaller than maximum thickness T1 of superconducting material layer 5 located on first main surface 1a. Respective maximum thicknesses of intermediate layer 3 and protective layer 7 that are located on second main surface 1b are also smaller than respective maximum thicknesses of intermediate layer 3 and protective layer 7 that are located on first main surface 1a, respectively. Superconducting wire 10E can therefore produce similar effects to those of superconducting wire 10 shown in FIG. 1.

Figure 14:
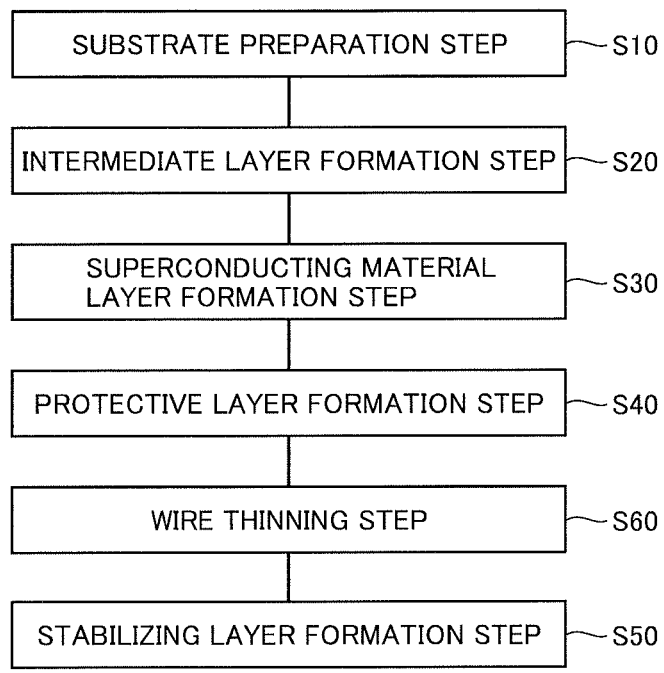
FIG. 14 is a flowchart showing a method of manufacturing the superconducting wire in the fourth embodiment.

FIG. 14 is a flowchart showing a method of manufacturing the superconducting wire in the fourth embodiment. Referring to FIG. 14, basically the method of manufacturing the superconducting wire in the fourth embodiment has similar features to those of the method of manufacturing the superconducting wire in the first embodiment described above based on FIGS. 4 to 8. The former method, however, differs from the first embodiment, in that the former method includes a wire thinning step.

Referring to FIG. 14, initially a substrate preparation step (S10) is performed. Specifically, a substrate 1 formed of an orientation-aligned metal substrate and having a wide tape shape is prepared. The width of substrate 1 at this time may for example be a width (8 mm, for example) that is approximately twice as large as the width (4 mm, for example) of substrate 1 in superconducting wire 10E.

Next, on this wide substrate 1, an intermediate layer formation step (S20), a superconducting material layer formation step (S30), and a protective layer formation step (S40) are performed in this order. The intermediate layer formation step, the superconducting material layer formation step, and the protective layer formation step are performed similarly to the corresponding steps in the first embodiment. These steps are thus performed to form a wide multilayer stack 20.

Next, a wire thinning step (S60) of cutting wide multilayer stack 20 into those each having a predetermined width (4 mm, for example) is performed. Specifically, rotary blades are used to perform mechanical slitting for mechanically cutting the multilayer stack of 8 mm in width into those each having a width of 4 mm.

In the wire thinning step (S60), multilayer stack 20 having a size in the width direction of approximately 8 mm for example is cut, in the width direction, into halves so as to produce two multilayer stacks 20 each having a width of 4 mm. Multilayer stack 20 shown in FIG. 13 is one of these multilayer stacks. Respective cut surfaces of two multilayer stacks 20 that are exposed by this cutting may each form one end face in the width direction. In multilayer stack 20 shown in FIG. 13, second side surface 1d of substrate 1 is exposed and covered by none of intermediate layer 3, superconducting material layer 5 and protective layer 7. The other multilayer stack 20 (not shown) facing the cut surface of multilayer stack 20 shown in FIG. 13 has exposed first side surface 1c of substrate 1. Specifically, in multilayer stack 20 which is not shown, intermediate layer 3, superconducting material layer 5 and protective layer 7 entirely cover first main surface 1a and second side surface 1d of substrate 1 and partially cover second main surface 1b. In contrast, first side surface 1c is covered by none of intermediate layer 3, superconducting material layer 5 and protective layer 7 and is therefore exposed.

In the wire thinning step (S60), laser processing may be performed to cut the multilayer stack into thin wires. Multilayer stack 20 shown in FIG. 13 can also be obtained by adjusting the conditions for the laser processing.

Next, a stabilizing layer formation step (S50) of forming a stabilizing layer 9 on the periphery of multilayer stack 20 having undergone the wire thinning is performed. The stabilizing layer formation step is performed similarly to the first embodiment. The above-described steps are performed to thereby manufacture superconducting wire 10E shown in FIG. 13.

Fifth Embodiment

Figure 15:
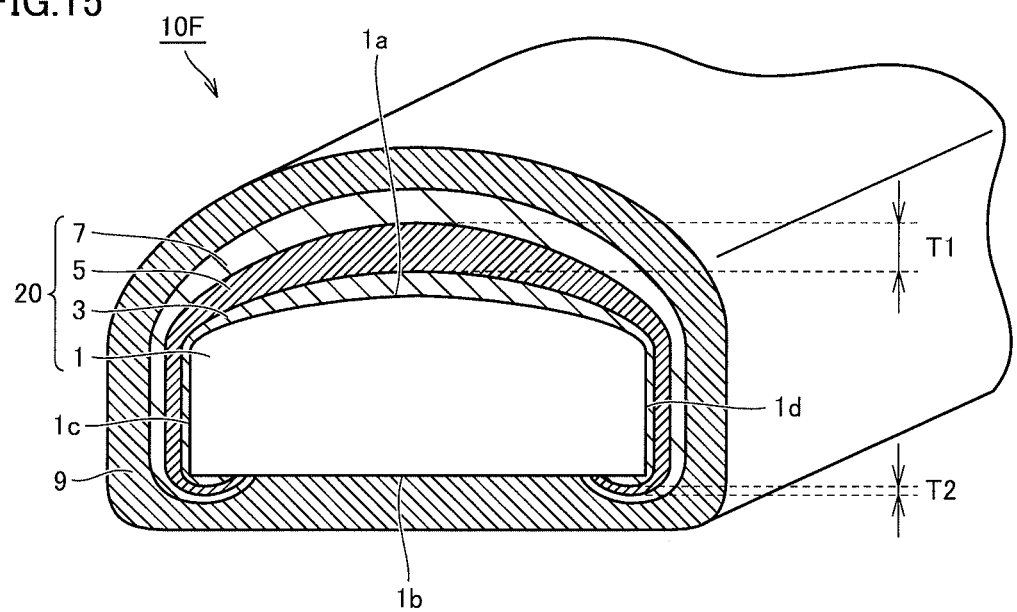
FIG. 15 is a schematic cross-sectional view showing a configuration of a superconducting wire in a fifth embodiment.

FIG. 15 is a schematic cross-sectional view showing a configuration of a multilayer stack of a superconducting wire 10F in a fifth embodiment. FIG. 15 shows a cross section in the transverse direction to the direction in which superconducting wire 10F extends.

Referring to FIG. 15, basically superconducting wire 10F in the fifth embodiment has a similar structure to superconducting wire 10 shown in FIG. 1, except that the structure of multilayer stack 20 differs from that of multilayer stack 20 shown in FIG. 2.

In superconducting wire 10F, first main surface 1a of substrate 1 has an outwardly curved convex shape. The apex of this curve is located substantially at the center of first main surface 1a in the width direction. The ends of the curve are located at the ends of first main surface 1a in the width direction. Intermediate layer 3, superconducting material layer 5 and protective layer 7 are formed along first main surface 1a. Therefore, the upper surface (upper surface of protective layer 7) of multilayer stack 20 also has an outwardly curved convex shape. Intermediate layer 3, superconducting material layer 5 and protective layer 7 each have a thickness varying along the width direction. In multilayer stack 20 shown in FIG. 15, maximum thickness T2 of superconducting material layer 5 located on second main surface 1b is also smaller than maximum thickness T1 of superconducting material layer 5 located on first main surface 1a.

Regarding superconducting wire 10F, first main surface 1a is curved. Therefore, the surface area of first main surface 1a can be increased as compared with substrate 1 having flat first main surface 1a. Intermediate layer 3 and superconducting material layer 5 are formed to entirely cover first main surface 1a having the curved portion, and therefore, the bonding area between substrate 1 and intermediate layer 3 and the bonding area between substrate 1 and superconducting material layer 5 can be increased. Accordingly, the bonding strength between substrate 1 and intermediate layer 3 and the bonding strength between substrate 1 and superconducting material layer 5 can further be increased.

The curved surface portion may be the whole of first main surface 1a as shown in FIG. 15, or a part of first main surface 1a. The curved surface portion may be in an outwardly curved convex shape, or may be curved toward second main surface 1b (concave shape).

Figure 16:
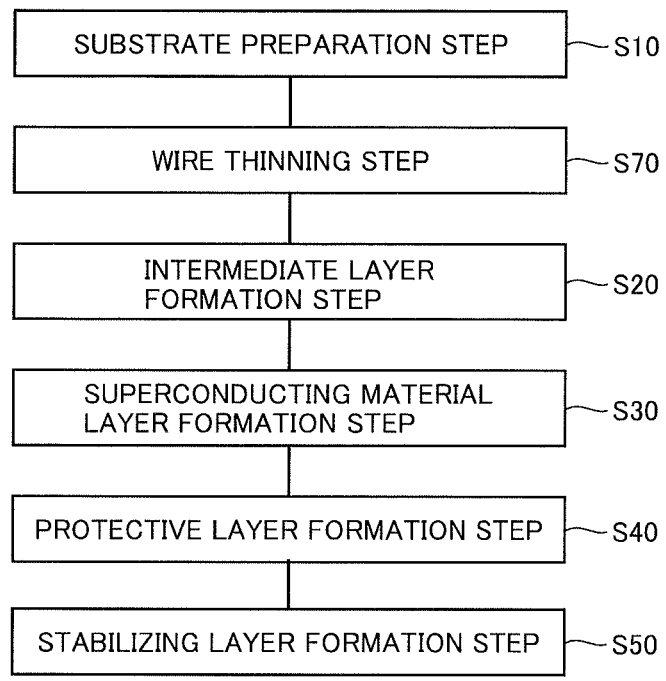
FIG. 16 is a flowchart showing a method of manufacturing the superconducting wire in the fifth embodiment.

FIG. 16 is a flowchart showing a method of manufacturing the superconducting wire in the fifth embodiment. Referring to FIG. 16, basically the method of manufacturing the superconducting wire in the fifth embodiment has similar features to those of the method of manufacturing the superconducting wire in the first embodiment described above based on FIGS. 4 to 8. The former method, however, differs from the first embodiment, in that the former method includes a wire thinning step.

Referring to FIG. 16, initially a substrate preparation step (S10) is performed. Specifically, a substrate 1 formed of an orientation-aligned metal substrate and having a wide tape shape (approximately 30 mm in width) is prepared.

Next, a wire thinning step (S70) of cutting substrate 1 having a width of 30 mm into those each having a predetermined width (4 mm, for example) is performed. Specifically, as shown in FIG. 17, rotary blades are used to perform mechanical slitting for mechanically cutting substrate 1 having a width of 30 mm into those each having a width of 4 mm.

Figure 17:
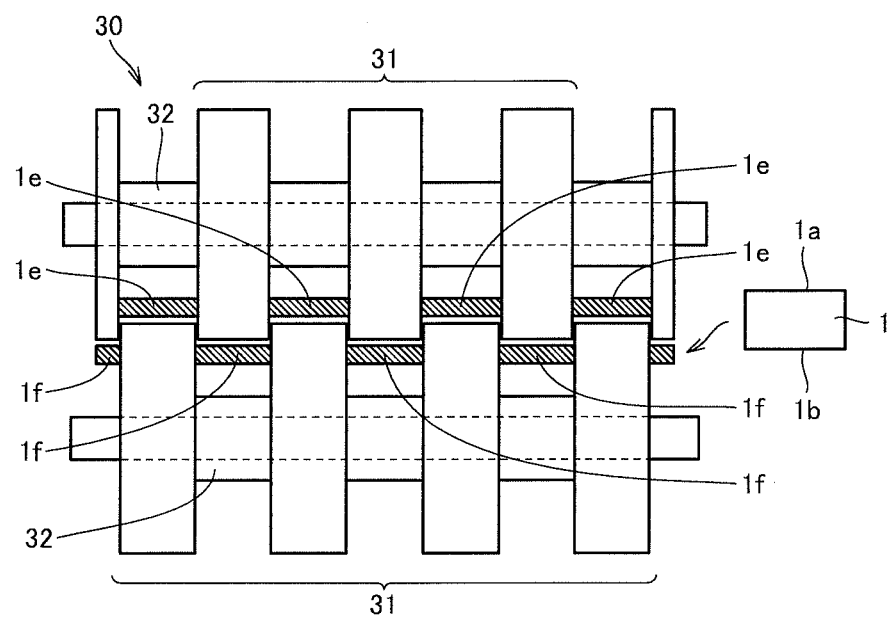
FIG. 17 is a diagram schematically showing a configuration of a slitter used for a wire thinning step.

FIG. 17 schematically shows a configuration of a slitter used for the wire thinning step. At the right side in FIG. 17, the configuration of substrate 1 undergoing slitting by slitter 30 is shown.

Referring to FIG. 17, slitter 30 includes a plurality of rotary blades 31 and a plurality of spacers 32. Slitter 30 includes seven rotary blades 31 in total, for example. On an upper rotational shaft of slitter 30, three rotary blades 31 each having a width of about 4 mm are arranged. Between rotary blades 31 adjacent to each other in the direction of the rotational axis, spacer 32 is disposed. On a lower rotational shaft of slitter 30 as well, four rotary blades 31 each having a width of about 4 mm are arranged. The width of rotary blades 31 arranged on the upper rotational shaft and the lower rotational shaft may be set to any width.

Figure 18:
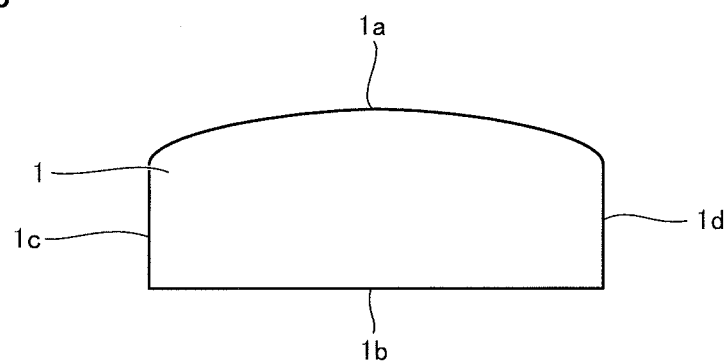
FIG. 18 is a schematic cross-sectional view for illustrating the method of manufacturing the superconducting wire in the fifth embodiment.

As shown in FIG. 17, substrate 1 that is slit with rotary blades 31 contacting second main surface 1b has a cross-sectional shape in which a central portion of first main surface 1a in the width direction protrudes (first main surface 1a has a convex shape), as a result of adjustment of slitting conditions such as the clearance between adjacent rotary blades 31 and the vertical overlapping of rotary blades 31. In this way, substrate 1 having a cross-sectional shape as shown in FIG. 18 can be obtained. In contrast, substrate 1 that is slit with rotary blades 31 contacting first main surface 1a has a cross-sectional shape in which a central portion of second main surface 1b in the width direction protrudes (second main surface 1b has a convex shape), as a result of adjustment of slitting conditions such as the clearance between adjacent rotary blades 31 and the vertical overlapping of rotary blades 31.

As described above, the mechanical slitting cuts substrate 1 through shearing by means of upper rotary blades 31 and opposite lower rotary blades 31. Resultant thin wires (substrate 1) each have curved edges depending on the direction in which rotary blades 31 are applied (direction of slitting). Specifically, regarding thin wires (substrate 1e) produced by slitting from first main surface 1a side with upper rotary blades 31, edges of substrate 1 are curved in the direction toward first main surface 1a. In contrast, regarding thin wires (substrate 1f) produced by slitting from second main surface 1b side with lower rotary blades 31, edges of substrate 1 are curved in the direction toward second main surface 1b and accordingly first main surface 1a has a convex shape.

As to the mechanical slitting shown in FIG. 17, rotary blades 31 applied to first main surface 1a are identical in width to rotary blades 31 applied to second main surface 1b. However, rotary blades 31 applied to second main surface 1b may have a predetermined width (4 mm for example) and rotary blades 31 applied to first main surface 1a may have a thinner width. In this way, the number of thinned wires (substrate 1 having first main surface 1a in a convex shape as shown in FIG. 18) obtained by slitting from second main surface 1b side can be increased.

Next, on substrate 1 shown in FIG. 18, an intermediate layer formation step (S20), a superconducting material layer formation step (S30) and a protective layer formation step (S40) are performed in this order. The intermediate layer formation step, the superconducting material layer formation step and the protective layer formation step are each performed similarly to the first embodiment. These steps are performed to thereby form multilayer stack 20 shown in FIG. 15.

Next, a stabilizing layer formation step (S50) of forming stabilizing layer 9 on the periphery of multilayer stack 20 is performed. The stabilizing layer formation step is performed similarly to the first embodiment. These steps are performed to thereby manufacture superconducting wire 10F shown in FIG. 15.

Modification of Fifth Embodiment

Figure 19:
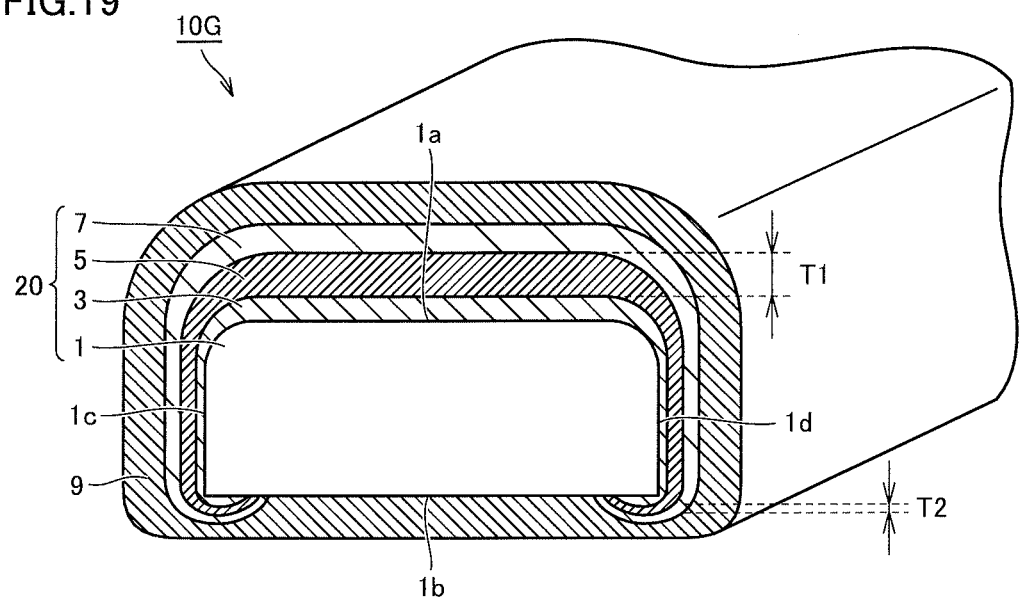
FIG. 19 is a schematic cross-sectional view showing a configuration of a superconducting wire according to a modification in the fifth embodiment.

FIG. 19 is a schematic cross-sectional view showing a configuration of a superconducting wire 10G according to a modification in the fifth embodiment. FIG. 19 shows a cross section in the transverse direction to the direction in which superconducting wire 10G extends.

Referring to FIG. 19, basically superconducting wire 10G according to the modification has a similar structure to superconducting wire 10 shown in FIG. 1, except that the structure of multilayer stack 20 differs from that of multilayer stack 20 shown in FIG. 2.

Regarding superconducting wire 10G, first main surface 1a of substrate 1 has curved portions at the ends in the width direction of substrate 1. Accordingly, first main surface 1a has an outwardly curved convex shape. Intermediate layer 3, superconducting material layer 5 and protective layer 7 each have a thickness varying along the width direction. Regarding superconducting wire 10G, maximum thickness T2 of superconducting material layer 5 located on second main surface 1b is also smaller than maximum thickness T1 of superconducting material layer 5 located on first main surface 1a. Respective maximum thicknesses of intermediate layer 3 and protective layer 7 that are located on second main surface 1b are smaller than respective maximum thicknesses of intermediate layer 3 and protective layer 7 that are located on first main surface 1a, respectively.

As the curved portions are located at the ends in the width direction of substrate 1, the conformity of contraction of intermediate layer 3 and superconducting material layer 5 to contraction of substrate 1 can be improved at the ends of first main surface 1a in the width direction. Accordingly, intermediate layer 3 and superconducting material layer 5 can be prevented from peeling off from substrate 1.

Next, a method of manufacturing superconducting wire 10G shown in FIG. 19 is described. Basically superconducting wire 10G can be obtained by performing the steps (S10 to S70) shown in FIG. 16. In the above-described wire thinning step (S70), wide substrate 1 may be cut into those each having a predetermined width by laser processing, and first main surface 1a of resultant substrate 1 having been cut may undergo a process for forming curved portions at the ends of first main surface 1a in the width direction of substrate 1.

Regarding the configuration in which the superconducting material layer is disposed to cover the side surface(s) of the substrate and cover at least a part of the second main surface in the first to fifth embodiments, the description is given above of the configuration in which each of the intermediate layer, the superconducting material layer, and the protective layer covers the side surface(s) of the substrate and at least a part of the second main surface. The present invention, however, is not limited to this configuration but further encompasses a configuration in which the intermediate layer and the superconducting material layer cover the side surface(s) of the substrate and cover at least a part of the second main surface, a configuration in which only the superconducting material layer covers the side surface(s) of the substrate and cover at least a part of the second main surface, and a configuration in which the superconducting material layer and the protective layer cover the side surface(s) of the substrate and cover at least a part of the second main surface. Among these configurations, the configuration in which the intermediate layer and the superconducting material layer cover the side surface(s) of the substrate and cover at least a part of the second main surface is preferable in that the orientation alignment of the superconducting material layer can be improved in not only the first main surface but also the side surface(s) of the substrate and the second main surface of the substrate, and that peeling of the intermediate layer can be prevented.

While the configuration where the stabilizing layer is formed to cover the outer periphery of the multilayer stack is illustrated above in connection with the first to fifth embodiments, the stabilizing layer may be disposed on at least the upper surface of the multilayer stack. In this case, after the stabilizing layer is formed on the protective layer, an insulating coating layer may be formed to cover the outer periphery of the superconducting wire, for the purpose of protecting the superconducting wire.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

1, 1e, 1f substrate; 3 intermediate layer; 5 superconducting material layer; 7 protective layer; 9 stabilizing layer; 10, 10A-10G superconducting wire; 20 multilayer stack; 30 slitter; 31 rotary blade; 32 spacer

The invention claimed is:

1. A superconducting wire comprising:
   a substrate having a first main surface and a second main surface located opposite to the first main surface; and
   a superconducting material layer disposed on the first main surface of the substrate,
   along at least a part of the superconducting wire in a direction in which the superconducting wire extends, the superconducting material layer being disposed to cover a side surface of the substrate in a width direction of the substrate and cover at least a part of the second main surface,
   a thickness of the superconducting material layer located on the first main surface varying along the width direction,
   a maximum thickness of the superconducting material layer located on the second main surface being smaller than a maximum thickness of the superconducting material layer located on the first main surface and a maximum thickness of the superconducting material layer located on the side surface.

2. The superconducting wire according to claim 1, further comprising an intermediate layer disposed between the first main surface of the substrate and the superconducting material layer, wherein
   along at least a part of the superconducting wire in the direction in which the superconducting wire extends, the intermediate layer is disposed to cover the side surface of the substrate and cover at least a part of the second main surface, and
   a maximum thickness of the intermediate layer located on the second main surface is smaller than a maximum thickness of the intermediate layer located on the first main surface.

3. The superconducting wire according to claim 1, further comprising a protective layer formed on the superconducting material layer, wherein
   along at least a part of the superconducting wire in the direction in which the superconducting wire extends, the protective layer is disposed to cover the side surface of the substrate and cover at least a part of the second main surface, and
   a maximum thickness of the protective layer located on the second main surface is smaller than a maximum thickness of the protective layer located on the first main surface.

4. The superconducting wire according to claim 1, wherein
   the thickness of the superconducting material layer located on the first main surface varies along the width direction in a manner that the thickness of a central portion of the superconducting material layer in the width direction is larger than the thickness of at least one end of the superconducting material layer in the width direction.

5. The superconducting wire according to claim 1, wherein
   the thickness of the superconducting material layer located on the first main surface varies along the width direction in a manner that the thickness of at least one end of the superconducting material layer in the width direction is larger than the thickness of a central portion of the superconducting material layer in the width direction.

6. The superconducting wire according to claim 1, wherein
   along at least a part of the superconducting wire in the direction in which the superconducting wire extends, the superconducting material layer located on one end of the second main surface in the width direction is separate from the superconducting material layer located on another end of the second main surface in the width direction.

7. The superconducting wire according to claim 1, wherein
   the superconducting material layer is disposed directly or indirectly on the first main surface of the substrate.

8. The superconducting wire according to claim 1, wherein
   the first main surface of the substrate includes a curved portion.

9. The superconducting wire according to claim 8, wherein
   the curved portion is located at an end of the first main surface in the width direction.

10. The superconducting wire according claim 1, wherein the superconducting material layer is made of an oxide superconducting material.

* * * * *